(12) United States Patent
Hirono et al.

(10) Patent No.: US 9,109,284 B2
(45) Date of Patent: Aug. 18, 2015

(54) VACUUM PROCESSING APPARATUS

(75) Inventors: Takayoshi Hirono, Kanagawa (JP); Isao Tada, Kanagawa (JP)

(73) Assignee: ULVAC, INC., Kanagawa (JP)

( * ) Notice: Subject to any disclaimer, the term of this patent is extended or adjusted under 35 U.S.C. 154(b) by 115 days.

(21) Appl. No.: 13/823,192

(22) PCT Filed: Sep. 7, 2011

(86) PCT No.: PCT/JP2011/005005
§ 371 (c)(1),
(2), (4) Date: Mar. 14, 2013

(87) PCT Pub. No.: WO2012/046384
PCT Pub. Date: Apr. 12, 2012

(65) Prior Publication Data
US 2013/0168243 A1    Jul. 4, 2013

(30) Foreign Application Priority Data
Oct. 6, 2010    (JP) ................................. 2010-227003

(51) Int. Cl.
C23C 14/56    (2006.01)
C23C 14/34    (2006.01)
C23C 14/50    (2006.01)

(52) U.S. Cl.
CPC ................ C23C 14/34 (2013.01); C23C 14/50 (2013.01); C23C 14/562 (2013.01)

(58) Field of Classification Search
CPC .................................................... C23C 14/562
USPC ....................... 118/718; 204/298.25; 428/688
See application file for complete search history.

(56) References Cited

U.S. PATENT DOCUMENTS 5,460,853 A    10/1995  Hintz et al.
6,186,090 B1 *  2/2001  Dotter et al. .................. 118/718
(Continued)

FOREIGN PATENT DOCUMENTS

JP    47-29465 A    11/1972
JP    01-230775 A    9/1989
(Continued)

OTHER PUBLICATIONS

International Search Report for PCT Patent App. No. PCT/JP2011/005005 (Dec. 13, 2011).

Primary Examiner — Keith Hendricks
Assistant Examiner — Timon Wanga
(74) Attorney, Agent, or Firm — Cermak Nakajima & McGowan LLP; Tomoko Nakajima

(57) ABSTRACT

Provided is a low-cost vacuum processing apparatus which enables the miniaturization of the apparatus and achieves good productivity. An elongated sheet base material is transported through a vacuum processing chamber, and predetermined processing is performed on the sheet base material in this vacuum processing chamber. The vacuum processing chamber is provided with a single processing unit, and has an auxiliary vacuum chamber provided in continuation with the vacuum processing chamber. The auxiliary vacuum chamber is provided with a feed roller and a take-up roller. The vacuum processing apparatus includes a pair of first roller units provided on opposite sides across the processing unit in the vacuum processing chamber. Each of the first roller units has multiple rollers disposed at regular distances. The rollers are deviated from each other in the axial direction and arranged in such a staggered manner that the sheet base material is helically wound around the rollers.

4 Claims, 3 Drawing Sheets

(56) References Cited

U.S. PATENT DOCUMENTS

| | | | |
|---|---|---|---|
| 7,736,438 B2* | 6/2010 | Storer et al. | 118/718 |
| 2006/0192964 A1* | 8/2006 | Lotz et al. | 356/429 |
| 2010/0215986 A1* | 8/2010 | Iwase et al. | 428/688 |
| 2010/0242842 A1* | 9/2010 | Takeuchi et al. | 118/718 |

FOREIGN PATENT DOCUMENTS

| | | |
|---|---|---|
| JP | 06-057415 A | 3/1994 |
| JP | 2005-113165 A | 4/2005 |
| JP | 2007-224384 A | 9/2007 |
| JP | 2009-013473 A | 1/2009 |

* cited by examiner

VACUUM PROCESSING APPARATUS

This application is a national phase entry under 35 U.S.C. §371 of PCT Patent Application No. PCT/JP2011/005005, filed on Sep. 7, 2011, which claims priority under 35 U.S.C. §119 to Japanese Patent Application No. 2010-227003, filed Oct. 6, 2010, both of which are incorporated by reference.

TECHNICAL FIELD

The present invention relates to a vacuum processing apparatus for performing predetermined processing in a vacuum processing chamber on an elongated sheet base material by transporting it through the vacuum processing chamber.

BACKGROUND ART

Elongated sheet base materials made of resin have flexibility and good processability, and is accordingly publicly known to be used to fabricate electronic parts or optical components by the steps of forming a predetermined thin film such as a predetermined metal or oxide film on surfaces of the elongated sheet base materials, performing heat treatment or plasma processing thereof, and the like. Depending on the use of an elongated sheet base material, the same predetermined processing may be performed on both of the front and back surfaces of the sheet base material.

As an apparatus for performing predetermined processing on both of the front and back surfaces of such a sheet base material, there has been kwon an apparatus in which a first processing chamber and a second processing chamber are both provided in continuation with a transportation chamber including a feed roller, a take-up roller, and transporting means for feeding and transporting a sheet base material. The first processing chamber includes a processing means for performing predetermined processing on one surface (front surface) of the sheet base material, and the second processing chamber includes another processing means for performing the same processing as the foregoing on the other surface (back surface) of the sheet base material having the one surface already subjected to the processing (e.g., see Patent Document 1).

However, in the above-described apparatus of the known example, since the front and back surfaces of the sheet base material are processed in the separate processing chambers, the system itself becomes large in size, and also requires a large number of parts, which leads to high cost. Further, the productivity is low since the apparatus has a long path along which the sheet base material fed from the feed roller is passed through the two vacuum processing chambers and is then wound around the take-up roller.

PRIOR ART DOCUMENTS

Patent Documents

Patent Document 1: Japanese Patent Application Publication No. 2009-13473

SUMMARY OF THE INVENTION

Problems to be Solved by the Invention

In view of the above-described circumstances, an objective of this invention is to provide a low-cost vacuum processing apparatus which enables the miniaturization of the system and has good productivity.

Means for Solving the Problems

To solve the above-described problems, this invention is a vacuum processing apparatus for performing predetermined processing in a vacuum processing chamber on an elongated sheet base material transported through the vacuum processing chamber, the vacuum processing chamber comprising a single processing unit and an auxiliary vacuum chamber disposed in continuation with the vacuum processing chamber and having therein at least one of a feed roller and a take-up roller. The vacuum processing apparatus comprises: a pair of first roller units disposed on opposite sides across the processing unit in the vacuum processing chamber, each of the first roller units having a plurality of rollers disposed at an equal distance from one another, the plurality of rollers of the first roller units being positionally shifted from one another in an axial direction in such a staggered manner as to allow the sheet base material to be helically wound around each of the rollers; and shifting means for shifting part of the sheet base material by a predetermined width toward the processing unit while a back surface of the sheet base material faces the processing roller, provided that a front surface is defined to be one surface of the sheet base material that faces the processing unit when traveling from each of the rollers on one side of the first roller unit to the other side of each of the rollers on the other side thereof.

According to this invention, the pair of roller units transports the sheet base material therearound such that the front and back surfaces of the sheet base material alternately face the processing unit in front of the processing unit, and the shifting means shifts portions of the sheet base material so that, for example, the distances from the processing unit to the front surface of, and to the back surface of, the sheet base material may be approximately equal to each other. Accordingly, the same processing can be efficiently performed on the front and back of the sheet base material with a single processing unit. As a result, plural processing chambers are not needed unlike the aforementioned known example. Thus, the apparatus can be miniaturized, and cost can be reduced by reducing the number of parts. Also, in an arrangement in which each of the front and back surfaces of the sheet base material faces the processing unit for multiple times, the speed of transportation of the sheet can be improved, and good productivity can also be obtained.

In this invention, it is preferable that the shifting means comprises another pair of second roller units disposed inward of the pair of the first roller units and on the opposite sides of the processing unit. The second roller units are preferably disposed such that the distances from the processing unit to the portions of the sheet base material shifted toward the processing unit are equivalent to the distances from the processing unit to the portions of the sheet base material to travel from each of the rollers of the first roller unit toward each of the rollers of the other side. This enables the distances from the processing unit to the front surface of, and to the back surface of, the sheet base material to be made approximately equal to each other with a simple arrangement. It should be noted that in this invention, the word "equivalent" includes not only the case where the distances from the processing unit to the front surface of, or to the back surface of, the sheet base material are precisely equal to each other but also the case where: for example, deposition is simultaneously performed on the front surface of, or to the back surface of, the sheet base material by using a cathode unit for film deposition by sputtering as the processing unit; and the second roller units are located close to or away from the cathode unit so that films having the same film thickness can be formed.

Moreover, in this invention, when the processing unit is a cathode unit for film deposition by sputtering, the cathode unit is preferably disposed on one wall surface defining the vacuum processing chamber, and the auxiliary vacuum chamber is disposed in continuation with another wall surface that faces the said one wall surface. The feed roller and the take-up roller are disposed in the auxiliary vacuum chamber. This arrangement has an advantage in that the vacuum processing apparatus can be further miniaturized.

If, for example, deposition is performed with the sheet base material heated to a predetermined temperature, and then the sheet base material directly after processing is wound around the take-up roller, problems such as the deterioration of the processed surfaces of the sheet base material may occur. Accordingly, for example, the sheet base material after processing is cooled to a predetermined temperature or less and then wound around the take-up roller. For this cooling, one conceivable way is to cool a rotary shaft of the guide roller or of the take-up roller to cool the sheet base material by heat exchanging. However, this complicates the arrangement of the system.

Accordingly, preferably a cooling panel is disposed so as to face the sheet base material on an upstream side of the take-up roller. Then, the surface of the cooling panel which faces the sheet base material functions as a heat absorbing surface. Thus, the sheet base material can be efficiently cooled. Also, in the case where the cooling panel is, for example, a cryopanel maintained at an extremely low temperature (several tens of K, water and the like in the auxiliary vacuum chamber are adsorbed by the panel, and this contributes to maintaining a high degree of vacuum in the auxiliary vacuum chamber. This is advantageous because, for example, a low-cost pump having a low pumping capacity may be employed as a pump to be provided in the auxiliary vacuum chamber.

MODES FOR CARRYING OUT THE INVENTION

Hereinafter, with reference to the drawings, a vacuum processing apparatus of an embodiment of this invention will be described by taking as an example the case where a processing unit is a cathode unit for film deposition by sputtering and where a film is formed on each of front and back surfaces of a sheet base material.

Figure 1:
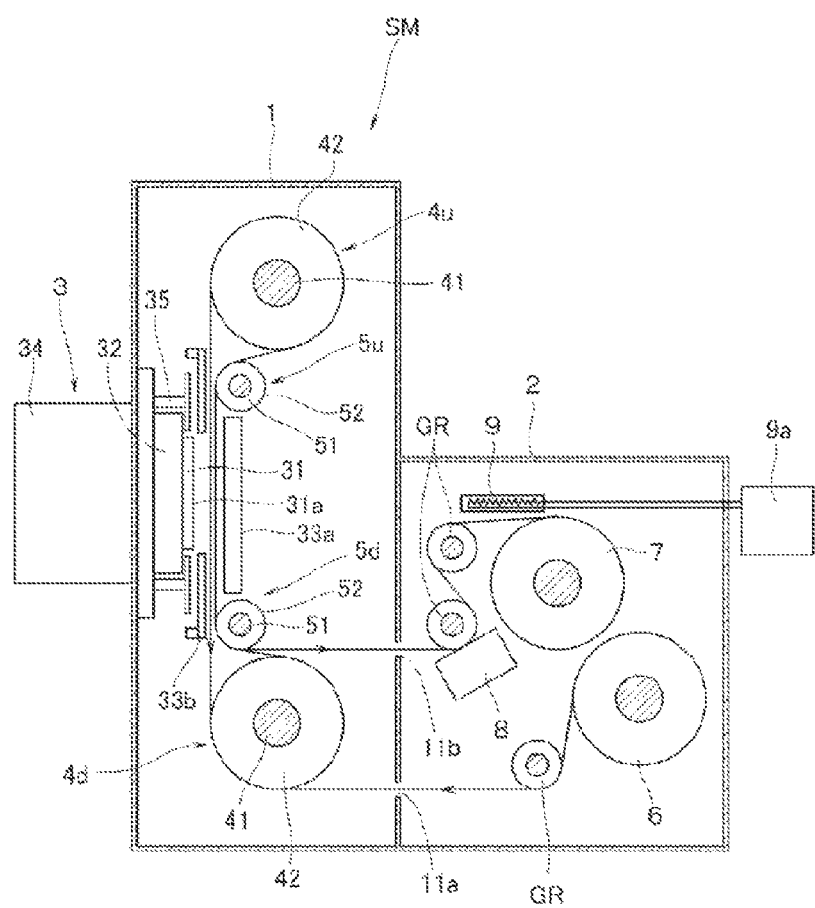
FIG. 1 is a schematic cross-sectional view showing a vacuum processing apparatus of a first embodiment of this invention.
Figure 2:
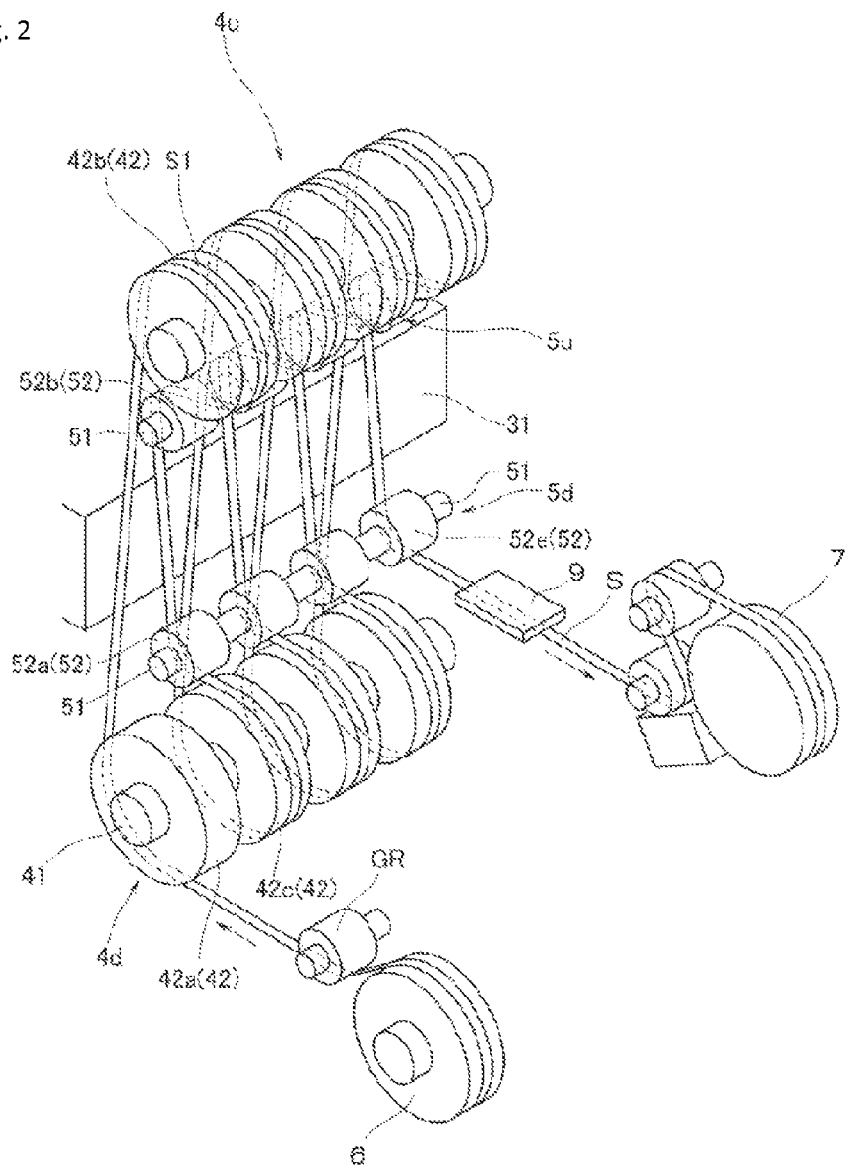
FIG. 2 is an enlarged partial perspective view for explaining the transportation of a sheet base material in a vacuum processing chamber.

Referring to FIGS. 1 and 2, SM denotes the vacuum processing apparatus of this embodiment. This vacuum processing apparatus SM includes a vacuum processing chamber 1 having a rectangular parallelepiped shape evacuated to a vacuum by a vacuum pump (not illustrated), and an auxiliary vacuum chamber 2 provided in continuation with one side surface of the vacuum processing chamber 1. A sheet base material S is transported from the auxiliary vacuum chamber 2 through the vacuum processing chamber 1, and a film can be formed on the sheet base material S in the vacuum processing chamber 1. A single cathode unit 3 is mounted on that another side surface of the vacuum processing chamber 1 which is opposite to the auxiliary vacuum chamber 2.

The cathode unit 3 includes a target 31 formed according to the composition of thin films to be formed on both of the front and back surfaces of the sheet base material S. The target 31 is, for example, of a rectangular shape, fabricated to have a width larger than the entire width of the sheet base material S to be transported around in front of the target 31 (see FIG. 2) as described later, and provided in the vacuum processing chamber 1 in a state of being bonded to a backing plate 32. It should be noted that the cathode unit 3 itself may be one having a publicly-known structure, and therefore will not be thoroughly described here. Moreover, in FIGS. 1, 33a and 33b denote shields, 34 denotes a cover of the cathode unit, and 35 denotes an anode ring.

In the vacuum processing chamber 1, a pair of roller units $4u$ and $4d$ are provided on opposite sides across the target 31 in the vertical direction thereof (i.e., up and down direction as seen in FIG. 1). These roller units are referred to as first roller units $4u$ and $4d$. The first roller units $4u$ and $4d$ have the same constitution, and each include a first shaft body 41 and four first rollers 42 rotatably mounted on the first shaft body 41 at regular intervals. Each of the first shaft bodies 41 is parallel to a sputtering surface (surface to be sputtered) $31a$ of the target 31 in an unused state, and disposed at a predetermined distance from the sputtering surface $31a$ of the target 31 (distances between the sputtering surface $31a$ and the two shafts 41 are equivalent to each other). Moreover, the first shaft bodies 41 are disposed such that the first rollers 42 of one of the first shaft bodies 41 are deviated (displaced) from the first rollers 42 of the other of the first shaft bodies 41 in the axial direction in a staggered manner. It should be noted that the arrangement of the first roller units $4u$ and $4d$ is not limited to the above-described one, and that the number of the first rollers 42 is also appropriately set with consideration given to the width of the sheet base material S and the deposition rate.

Moreover, in the vacuum processing chamber 1, another pair of roller units $5u$ and $5d$ are disposed inward of the first roller units $4u$ and $4d$ on opposite sides across the target 31 in the vertical direction thereof (vertical direction as seen in FIG. 1). This pair of roller units $5u$ and $5d$ constitute shifting means of this embodiment for shifting portions of the sheet base material S by a predetermined width toward the processing unit. The roller units constituting the shifting means are referred to as second roller units $5u$ and $5d$. The second roller units $5u$ and $5d$ have the same arrangement, and each includes a second shaft body 51 and four second rollers 52 rotatably mounted on the second shaft body 51 at equal distances from one another. The diameters of the second rollers 52 are set to be smaller than those of the first rollers 42. The second shaft bodies 51 are each parallel to the first shaft bodies 41, and disposed in the following manner: the second rollers 52 are located between the first rollers 42, the second rollers 52 of one of the second shaft bodies 51 are shifted (deviated) from the second rollers 52 of the other of the second shaft bodies 51 in the axial direction in a staggered manner, and the centers of the second shaft bodies 51 are closer to the cathode unit 3 than those of the first shaft bodies 41. In this case, the distances between the sputtering surface $31a$ and the two second shaft bodies 51 are also equivalent to each other. It should be noted that the arrangement of the second roller units $5u$ and $5d$ are not limited to the above-described one. For example, an arrangement may be employed in which the diameters of the second rollers 52 are set to be equal to those of the first rollers 42, and in which the first shaft bodies 41 and the second shaft bodies 51 are disposed in an identical single plane parallel to the sputtering surface $31a$ of the target 31. Moreover, the number and the like of the second rollers 52 are also appropriately set according to the first rollers 42.

The auxiliary vacuum chamber 2 is evacuated to a vacuum by a vacuum pump (not illustrated) in a manner similar to the vacuum processing chamber 1. In the auxiliary vacuum chamber 2, a feed roller 6 provided with a drive source (not illustrated) and a take-up roller 7 provided with a drive source (not illustrated) are provided. On the upstream side of the take-up roller 7, a measuring instrument 8 for measuring the tension in the sheet base material S is provided so that the numbers of revolutions of the feed roller 6 and the take-up roller 7 may be appropriately controlled according to the result of measurement by the measuring instrument 8. It should be noted that in FIG. 1, GR denotes guide rollers. A description will now be made of the transportation of the sheet base material S in which the sheet base material S is first fed from the feed roller 6 in the auxiliary vacuum chamber 2, then passed through the vacuum processing chamber 1, and finally wound around the take-up roller 7.

The sheet base material S fed from the feed roller 6 is passed through a through hole 11a formed in a contact surface between the vacuum processing chamber 1 and the auxiliary vacuum chamber 2, for further feeding to the vacuum processing chamber 1. In the vacuum processing chamber 1, the sheet base material S is first wound toward the cathode unit 3 (clockwise) around the first roller 42a located at one end (front side in FIG. 2) of the first roller unit 4d on the lower side in FIG. 1 in the axial direction, and wound from the cathode unit 3 side around the first roller 42b located at one end (front side in FIG. 2) of the first roller unit 4u on the upper side in the axial direction. In this state, one surface of the sheet base material S facing the target 31 in the cathode unit 3 is defined as a front surface, and passes through the sputtering surface 31a in parallel with the sputtering surface 31a.

The sheet base material S after passing the first roller 42b passes by the cathode unit 3 sides of the second rollers 52a and 52b located at one end of the second roller units 5u and 5d, serving as shifting means, in the axial direction (front side in FIG. 2), and is guided to the next roller 42c adjacent to the roller 42a located at one end (front side in FIG. 2) of the lower first roller unit 4d in the axial direction, thus being wound around the roller 42c from the side opposite to the cathode unit 3 (i.e., if the sheet base material S were to be wound around only the first roller units 4u and 4d, the sheet base material S would be wound in a manner to form a helix). At this time, while the sheet base material S is being transported between the two second rollers 52a and 52b, the back surface of a portion of the sheet base material S will be facing the sputtering surface 31a of the target 31 (i.e., the back surface of the sheet base material S passes by the sputtering surface 31a in a manner to be parallel to the sputtering surface 31a). Further, by appropriately setting the positions of the two second shaft bodies 51, the distance between the sputtering surface 31a of the target 31 and the front surface of the sheet base material S which is being transported between the first rollers 42a and 42b can be made approximately equal to the distance between the sputtered surface 31a of the target 31 and the back surface of the sheet base material S which is being transported between the second rollers 52a and 52b.

Similar to the above, the winding of the sheet base material S around each of the rollers 42 and 52 is performed to the other end in the axial direction. Further, the sheet base material S after passing the roller 52e located on the other side (back side in FIG. 2) of the second roller unit 5d on the lower side in the axial direction is passed through another through hole 11b formed in a contact surface between the vacuum processing chamber 1 and the auxiliary vacuum chamber 2 so as to be returned to the auxiliary vacuum chamber 2, and is wound around the take-up roller 7.

Thus, the sheet base material S is transported around such that the front and back surfaces thereof alternately face the cathode unit 3 at a position in front of the cathode unit 3. Further, when predetermined power having a negative potential is supplied to the target 3 from a power supply (not illustrated) with a noble gas introduced into a space in front of the target 31, plasma is formed in a space in front of the sputtering surface 31a of the target 31, and the target 31 is sputtered. Thus, sputtered particles scattered from the target adhere to and are deposited on both of the front and back surfaces of the sheet base material S, and predetermined thin films having approximately the same thicknesses are formed on both of the front and back surfaces of the sheet base material S.

As described above, according to the above-described embodiment, the first roller units 4u and 4d cause the sheet base material S to be transported around such that the front and back surfaces of the sheet base material S alternately face the cathode unit 3 at a position in front of the cathode unit 3, and the second roller units 5u and 5d constituting the shifting means make approximately equal to each other the distances from the cathode unit 3 to the front and back surfaces of the sheet base material S to be subjected to film deposition. Accordingly, films having approximately the same film thicknesses can be efficiently formed on both of the front surface of, and the back surface of, the sheet base material S with the single cathode unit 3. Accordingly, since a plurality of processing chambers are not needed unlike the aforementioned known example, the system can be miniaturized, and cost can be reduced by reducing the number of parts. Also, since each of the front and back surfaces of the sheet base material S comes to face the processing unit for a plurality of times, the speed of transportation of the sheet base material S can be improved, and good productivity can also be obtained. Moreover, the cathode unit 3 and the auxiliary vacuum chamber 2 are disposed on two opposite surfaces of wall surfaces defining the vacuum processing chamber 1, and the feed roller 6 and the take-up roller 7 are disposed in the auxiliary vacuum chamber 2. Accordingly, the vacuum processing apparatus SM can be further miniaturized.

For example, in case where deposition is performed on the sheet base material S, the following may be performed depending on the use of the sheet base material S: heating means (not illustrated) is provided on the downstream side of the feed roller 6, the sheet base material S is heated to a predetermined temperature prior to deposition, and deposition is performed in this state. In such a case, when the sheet base material S directly after processing is wound around the take-up roller 7, problems such as the deterioration of films formed on the sheet base material S may occur.

As a solution, in this embodiment, a cryopanel (cooling panel) 9 is provided on the upstream of the take-up roller 7 in a manner to face the sheet base material (see FIG. 1). The cryopanel 9 includes a refrigeration unit 9a having a publicly-known structure, e.g., a closed-cycle helium refrigerator or the like, and is maintained at an extremely low temperature (e.g., several tens of K) by a coolant from the refrigeration unit 9a. In this case, a surface of the cryopanel 9 which faces the sheet base material S is formed to have a width larger than that of the sheet base material S. This enables that surface of the cryopanel 9 which faces the sheet base material S to function as a heat absorbing surface. Thus, the sheet base material S can be efficiently cooled. Also, water and the like in the auxiliary vacuum chamber 2 are adsorbed by the cryopanel 9, and this contributes to maintaining a high degree of vacuum in the auxiliary vacuum chamber 2. This is advantageous because, for example, a low-cost pump having a low pumping capacity may be employed as a pump provided in the auxiliary vacuum chamber 2. Moreover, the cryopanel 9 may be disposed to face the guide roll so that the sheet base material S may be cooled by cooling the guide roll itself.

It should be noted that although a description has been made in this embodiment by taking as an example the vacuum processing apparatus in which the cryopanel 9 is used as a cooling panel, a cooling panel is not limited to this as long as the cooling panel can absorb heat from the sheet base material S to cool the sheet base material S. Moreover, the method of cooling the sheet base material S of this invention using a cooling panel can also be widely applied to various other roll-fed vacuum processing apparatus including vacuum processing apparatus having structures such as in the aforementioned known example, not only to the vacuum processing apparatus of the above-described embodiment.

Although a description has been made in the above-described embodiment by taking as an example the vacuum processing apparatus in which the cathode unit 3 is used as the processing unit, this invention is not limited to this. The cathode unit may be a cathode unit including a resistance-heated evaporation source or a cathode unit by CVD. Moreover, this invention can also be applied to processing units for performing surface processing by providing plasma gas other than deposition sources.

Further, although a description has been made in the above-described embodiment by taking as an example the vacuum processing apparatus in which the pair of second roller units 5*u* and 5*d* constitute the shifting means, the shifting means is not particularly limited as long as the shifting means can shift portions of the sheet base material S by a predetermined width toward the processing unit 3. For example, the following arrangement may be employed: a drive shaft movable toward or away from the processing unit 3 and a roller rotatably attached to a tip of the drive shaft constitute the shifting means, and the shifting means is disposed on each of opposite sides across the processing unit, the two guide means are synchronously moved toward the processing unit to displace portions of the sheet base material S by a certain width toward the processing unit. This makes it possible to arbitrarily change the distance from the processing unit to the front surface of, and the distance from the processing unit to the back surface of, the sheet base material S, in a manner to be different from each other when needed.

Figure 3:
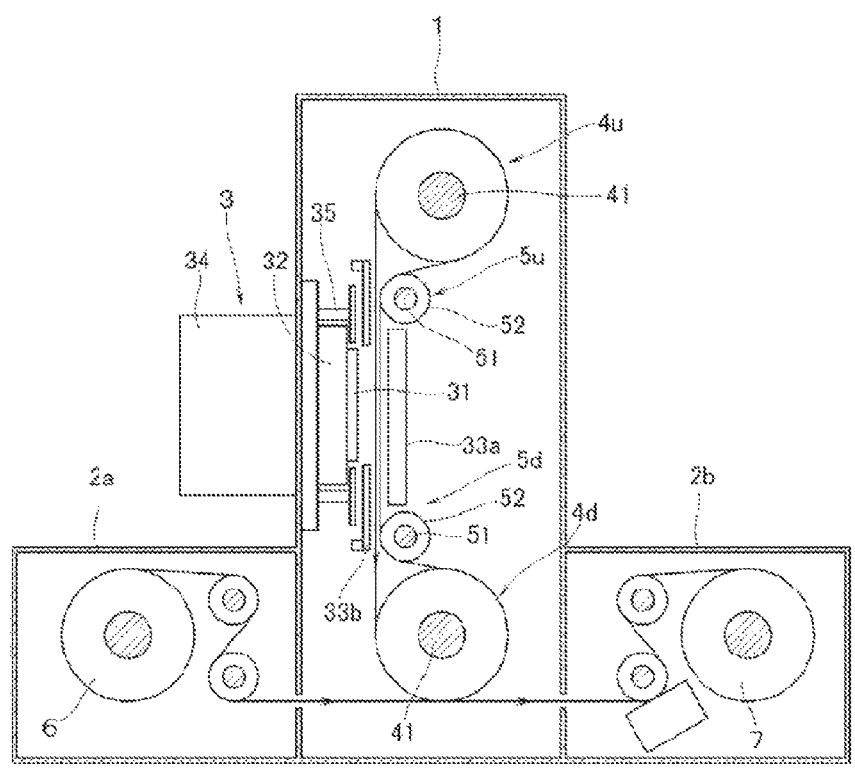
FIG. 3 is a schematic cross-sectional view showing a vacuum processing apparatus of a second embodiment.

Moreover, although a description has been made in the above-described embodiment by taking as an example the vacuum processing apparatus in which the feed roller and the take-up roller are provided in the single auxiliary vacuum chamber 2 so that the vacuum processing apparatus can be miniaturized to a maximum extent possible, the apparatus layout is not limited to this. For example, as shown in FIG. 3, an arrangement may be employed in which auxiliary vacuum chambers 2*a* and 2*b* are respectively provided on two opposite side surfaces of the vacuum processing chamber 1 in continuation with each other and in which a sheet base material is transported such that the sheet base material is fed from a feed roller 6 provided in the auxiliary vacuum chamber on the upstream side, passed through the vacuum processing chamber 1, and wound around a take-up roller 7 provided in the auxiliary vacuum chamber 2*b* on the downstream side.

EXPLANATION OF REFERENCE NUMERALS

SM . . . vacuum processing apparatus, 1 . . . vacuum processing chamber, 2 . . . auxiliary vacuum chamber, 3 . . . cathode unit (processing unit), 4*u*, 4*d* . . . first roller unit, 41 . . . first shaft body, 42 . . . first roller, 5*u*, 5*d* . . . second roller unit (shifting means), 51 . . . second shaft body, 52 . . . second roller, 6 . . . feed roller, 7 . . . take-up roller, 9 . . . cryopanel (cooling panel).

The invention claimed is:

1. A vacuum processing apparatus for performing predetermined processing in a vacuum processing chamber on an elongated sheet base material transported through the vacuum processing chamber, the vacuum processing chamber comprising a single processing unit and an auxiliary vacuum chamber disposed in continuation with the vacuum processing chamber and having therein at least one of a feed roller and a take-up roller, the vacuum processing apparatus comprising:

a pair of first roller units disposed on opposite sides across the processing unit in the vacuum processing chamber, the processing unit being located between the pair of first roller units, each of the first roller units having an axis and a plurality of rollers disposed along the axis and, each of the rollers being at an equal distance from adjacent rollers along the axis, the plurality of rollers of the first roller units being positionally shifted from one another in an axial direction in such a staggered manner as to allow the sheet base material to be helically wound around each of the rollers; and shifting means for shifting part of the sheet base material by a predetermined width toward the processing unit while a back surface of the sheet base material faces the processing unit, provided that a front surface is defined to be one surface of the sheet base material that faces the processing unit when traveling from each of the rollers on one side of the first roller unit to the other side of each of the rollers on the other side thereof.

2. The vacuum processing apparatus according to claim 1, wherein the shifting means comprises another pair of second roller units disposed inward of the pair of the first roller units and on the opposite sides of the processing unit, and wherein the second roller units are disposed such that the distances from the processing unit to the portions of the sheet base material shifted toward the processing unit are equivalent to the distances from the processing unit to the portions of the sheet base material to travel from each of the rollers of the first roller unit toward each of the rollers of the other side.

3. The vacuum processing apparatus according to claim 1, wherein, when the processing unit is a cathode unit for film deposition by sputtering, the cathode unit is disposed on one wall surface defining the vacuum processing chamber, and the auxiliary vacuum chamber is disposed in continuation with another wall surface that faces the said one wall surface, and wherein the feed roller and the take-up roller are disposed in the auxiliary vacuum chamber.

4. The vacuum processing apparatus according to claim 1, further comprising a cooling panel disposed so as to face the sheet base material on an upstream side of the take-up roller.

* * * * *